United States Patent
Shimbo

(10) Patent No.: US 9,941,263 B2
(45) Date of Patent: Apr. 10, 2018

(54) SEMICONDUCTOR INTEGRATED CIRCUIT DEVICE

(71) Applicant: SOCIONEXT INC., Yokohama-Shi, Kanagawa (JP)

(72) Inventor: Hiroyuki Shimbo, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/052,521

(22) Filed: Feb. 24, 2016

(65) Prior Publication Data

US 2016/0172351 A1  Jun. 16, 2016

Related U.S. Application Data

(63) Continuation of application No. PCT/JP2014/002236, filed on Apr. 21, 2014.

(30) Foreign Application Priority Data

Aug. 28, 2013 (JP) .................................. 2013-177182

(51) Int. Cl.
  *H01L 27/118* (2006.01)
  *H01L 27/02* (2006.01)
  (Continued)

(52) U.S. Cl.
  CPC ........ *H01L 27/0207* (2013.01); *H01L 23/528* (2013.01); *H01L 29/6681* (2013.01);
  (Continued)

(58) Field of Classification Search
  CPC ............. H01L 29/6681; H01L 27/0207; H01L 21/823431; H01L 29/785; H01L 29/66795;
  (Continued)

(56) References Cited

U.S. PATENT DOCUMENTS 8,258,577 B2    9/2012  Dixit
2009/0101940 A1*  4/2009  Barrows ............ H03K 19/1778
                                              257/204
(Continued)

FOREIGN PATENT DOCUMENTS

JP    2009-218499 A    9/2009
JP    2010-016258 A    1/2010
(Continued)

OTHER PUBLICATIONS

Internation Search Report issued in Application No. PCT/JP2014/002236 dated May 20, 2014, with partial English translation.
(Continued)

*Primary Examiner* — Khiem D Nguyen
(74) *Attorney, Agent, or Firm* — McDermott Will & Emery LLP

(57) ABSTRACT

Disclosed herein is a semiconductor integrated circuit device which includes a standard cell with a plurality of fins extending in a first direction and arranged in a second direction that is perpendicular to the first direction. An active fin of the fins forms part of an active transistor. A dummy fin of the fins is disposed between the active fin and an end of the standard cell.

2 Claims, 12 Drawing Sheets

(51) Int. Cl.
  *H01L 23/528* (2006.01)
  *H01L 29/66* (2006.01)
  *H01L 21/8238* (2006.01)
  *H01L 27/092* (2006.01)
  *H01L 27/12* (2006.01)
  *H01L 27/088* (2006.01)

(52) U.S. Cl.
  CPC .. *H01L 21/823821* (2013.01); *H01L 27/0886* (2013.01); *H01L 27/0924* (2013.01); *H01L 27/1211* (2013.01); *H01L 2924/0002* (2013.01)

(58) Field of Classification Search
  CPC ........... H01L 21/82321; H01L 27/0886; H01L 27/0924; H01L 21/823821
  See application file for complete search history.

(56) References Cited

U.S. PATENT DOCUMENTS

| | | | | |
|---|---|---|---|---|
| 2009/0230483 A1* | 9/2009 | Mizumura | ...... | H01L 21/823431 257/401 |
| 2010/0025767 A1* | 2/2010 | Inaba | ................ | H01L 29/41791 257/365 |
| 2010/0028809 A1* | 2/2010 | Vanleenhove | ........ | G03F 7/0035 430/312 |
| 2010/0187699 A1* | 7/2010 | Nishimura | ............ | H01L 23/522 257/776 |
| 2010/0287518 A1 | 11/2010 | Becker | | |
| 2010/0308414 A1 | 12/2010 | Dixit | | |
| 2012/0168875 A1 | 7/2012 | Tamaru et al. | | |
| 2013/0126978 A1 | 5/2013 | Becker et al. | | |
| 2013/0277760 A1* | 10/2013 | Lu | ........................... | H01L 29/10 257/401 |
| 2014/0061801 A1 | 3/2014 | Doornbos et al. | | |
| 2014/0097493 A1 | 4/2014 | Baek et al. | | |
| 2014/0258961 A1 | 9/2014 | Ke et al. | | |

FOREIGN PATENT DOCUMENTS

| | | |
|---|---|---|
| JP | 2010-040630 A | 2/2010 |
| WO | 2008/059440 A2 | 5/2008 |
| WO | 2011/077664 A1 | 6/2011 |

OTHER PUBLICATIONS

Written Opinion issued in Application No. PCT/JP2014/002236 dated May 20, 2014, with partial English translation.

* cited by examiner

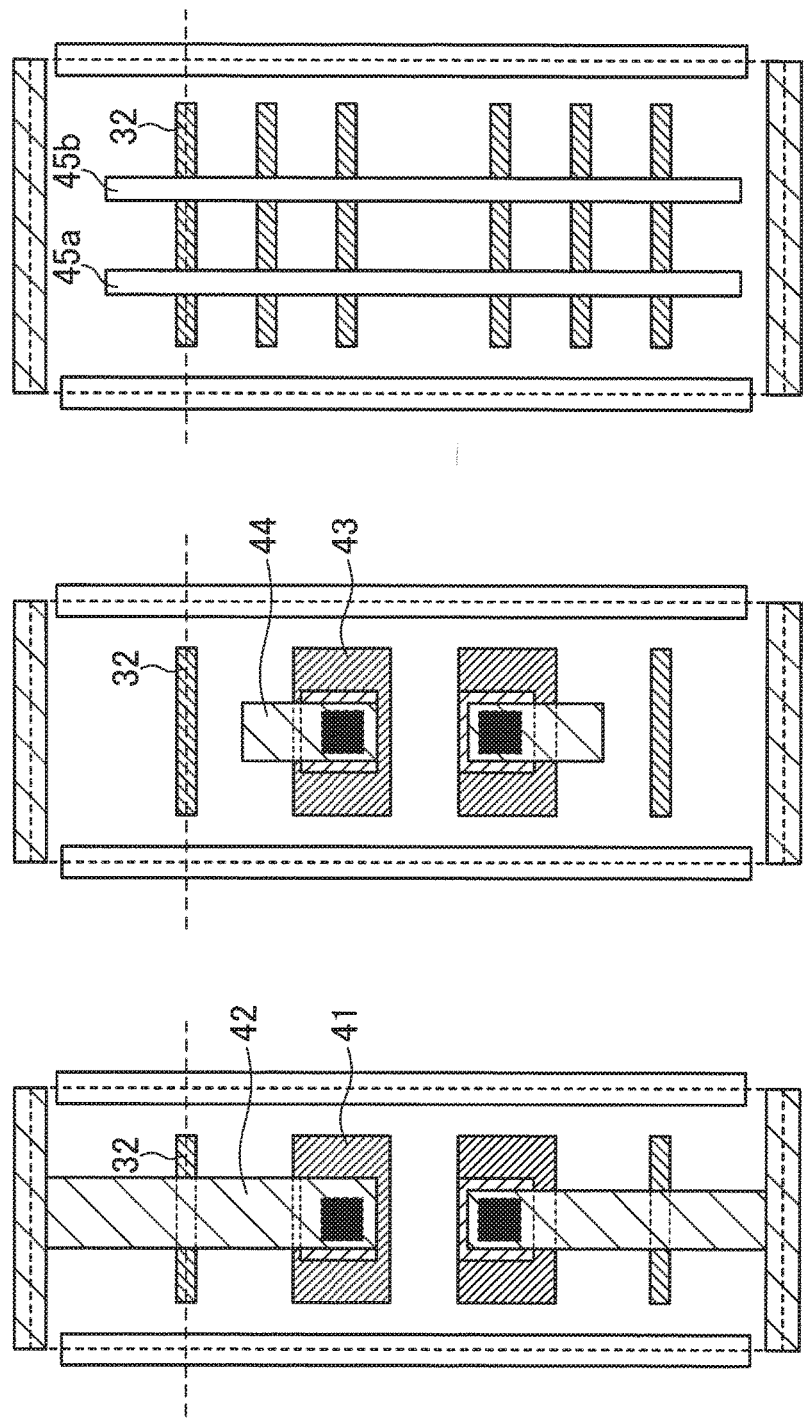

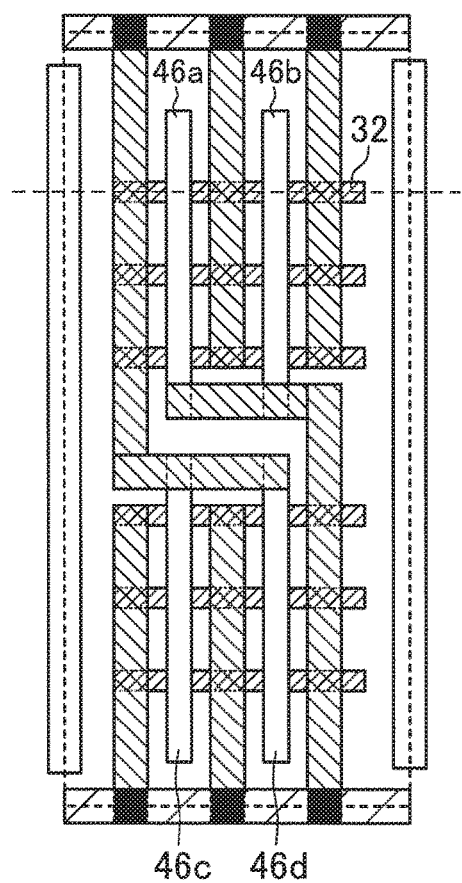
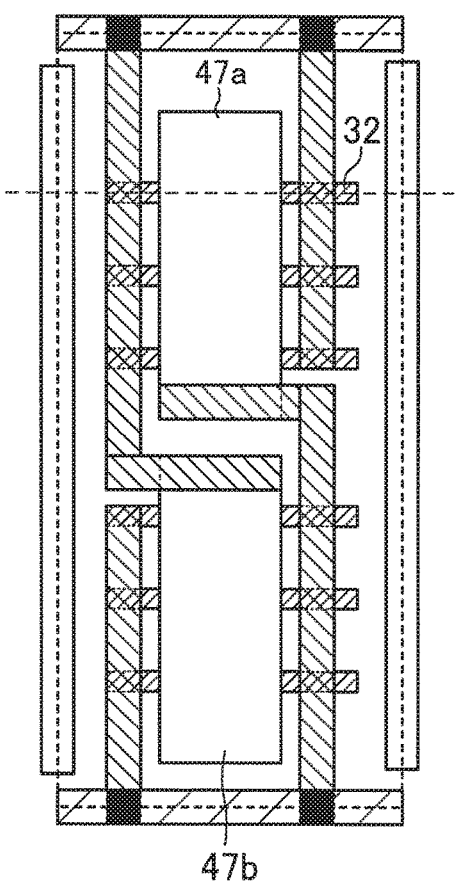

SEMICONDUCTOR INTEGRATED CIRCUIT DEVICE

CROSS-REFERENCE TO RELATED APPLICATIONS

This is a continuation of International Application No. PCT/JP2014/002236 filed on Apr. 21, 2014, which claims priority to Japanese Patent Application No. 2013-177182 filed on Aug. 28, 2013. The entire disclosures of these applications are hereby incorporated by reference.

BACKGROUND

The present disclosure relates to a semiconductor integrated circuit device including a standard cell with transistor having a fin structure.

A standard cell design has been known as a method of forming a semiconductor integrated circuit on a semiconductor substrate. The standard cell design refers to a method of designing a large-scale integrated circuit (LSI) chip by providing in advance, as standard cells, unit logic elements having particular logic functions (for example, an inverter, a latch, a flip-flop, and a full adder), laying out those standard cells on a semiconductor substrate, and connecting those standard cells together through a routing process.

Recently, it has been proposed to utilize transistors with a fin structure (hereinafter referred to as "fin transistors") in the field of semiconductor devices. FIG. 14 schematically illustrates a fin transistor. Unlike a metal oxide semiconductor (MOS) transistor having a two-dimensional structure, its source and drain have a raised, three-dimensional structure called "fin." Its gate is disposed so as to wrap around a channel region defined between the source and drain in this fin. In this fin structure, the channel region is defined by three surfaces of the fin, thereby improving channel controllability significantly compared to conventional ones. As a result, various advantages, including reducing the leakage power, increasing the ON-state current, and lowering the operating voltage, are achieved. This leads to improving the performance of the semiconductor integrated circuit.

U.S. Pat. No. 8,258,577 shows an exemplary standard cell including fin transistors (FIG. 2). Fins extending in the lateral direction are arranged in parallel with each other, and gate lines are arranged in the vertical direction.

SUMMARY

A fin transistor has its characteristics affected by a distance from itself to an adjacent one more strongly than an MOS transistor with a two-dimensional structure does. For example, the current characteristic of such a fin transistor varies according to the oxide definition (OD)-spacing-effect (OSE) caused depending on the distance from its own fin to another transistor's or with a change in physical stress. Also, the fin is raised from the surface of a substrate, and therefore, the capacitance characteristic of such a transistor also varies according to the distance from its own fin to another transistor's. That is to say, the fin transistor has current and capacitance characteristics varying according to the distance from itself to an adjacent one.

In the standard cell design, a standard cell may adjoin standard cells with various configurations. Accordingly, for example, as for a fin transistor disposed near an end of the cell, the distance from its own fin to an adjacent fin varies significantly depending on the design of the adjacent standard cell. Also, for example, in a standard cell arranged on the outer periphery of a circuit block, a fin may be disposed at an infinite distance from an adjacent fin. As can be seen, if the characteristic of such a fin transistor varies significantly according to the cell arrangement, its current and/or capacitance characteristic(s) need to be allowed a certain margin in advance with such a variation taken into account. This, however, may cause a decrease in the performance of the semiconductor integrated circuit or an increase in cost, which is not beneficial.

In view of the foregoing background, it is therefore an object of the present disclosure to reduce, in a semiconductor integrated circuit device including a standard cell with a fin transistor, such an influence of a cell arrangement on the characteristics of the fin transistor and eventually improve the performance of the semiconductor integrated circuit device.

A first aspect of the present disclosure provides a semiconductor integrated circuit device including a first standard cell having a fin transistor. The first standard has a plurality of fins extending in a first direction and arranged in a second direction that is perpendicular to the first direction. The plurality of fins includes: an active fin forming part of an active transistor; and a dummy fin disposed between the active fin and an end of the first standard cell in the second direction.

According to this aspect of the present disclosure, the distance between the active fin and the fin located closer to the end of the cell than the active fin is, i.e., the dummy fin, is determined uniquely regardless of the configuration of another standard cell arranged adjacent to the first standard cell. Thus, the active transistor formed by the active fin has a constant current characteristic regardless of the cell arrangement. This allows for reducing a design margin, and eventually improving the performance of the semiconductor integrated circuit device.

A second aspect of the present disclosure provides a semiconductor integrated circuit device including first and second standard cells each having fin transistors. Each of the first and second standard cells has a plurality of fins extending in a first direction and arranged in a second direction that is perpendicular to the first direction. The first and second standard cells are arranged adjacent to each other, and a dummy fin is disposed on a cell boundary between the first and second standard cells.

According to this aspect of the present disclosure, in the first and second standard cells, the distance between an active fin located near the cell boundary and a dummy fin disposed on the cell boundary is determined uniquely regardless of the configuration of an adjacent standard cell. Thus, the active transistor arranged near the cell boundary has a constant current characteristic regardless of the cell arrangement. This allows for reducing a design margin, and eventually improving the performance of the semiconductor integrated circuit device. Furthermore, the first and second standard cells share the dummy fin. This allows for reducing the cell area while achieving the above advantage. Consequently, the overall circuit area and manufacturing cost of the semiconductor integrated circuit device may be cut down.

A third aspect of the present disclosure provides a semiconductor integrated circuit device comprising: a first cell row comprised of standard cells arranged in a first direction; and a second cell row comprised of standard cells arranged in the first direction, and disposed adjacent to the first cell row in a second direction that is perpendicular to the first direction. The first cell row comprises: a first standard cell including an active transistor with a fin structure and having fins extending in the first direction; and a second standard cell including fins extending in the first direction, and the first standard cell has a first fin disposed closest to a cell row boundary between the first and second cell rows, and the second standard cell has a dummy fin disposed at the same position in the second direction as the first fin.

According to this aspect of the present disclosure, the fin located closest to the cell row boundary in the first standard cell and the dummy fin in the second standard cell are disposed at the same position in the second direction. Thus, the distance between the active fin of the second cell row, located near the cell row boundary, and the fin of the first cell row, located opposite the active fin across the cell row boundary, is determined uniquely regardless of the configuration of the standard cell in the first cell row. Thus, the active transistor located near the cell row boundary has a constant current characteristic regardless of the cell arrangement. This allows for reducing a design margin, and eventually improving the performance of the semiconductor integrated circuit device.

The present disclosure allows for reducing, in a semiconductor integrated circuit device including a standard cell with a fin transistor, an influence of a cell arrangement on the characteristics of the fin transistor. This thus allows for improving the performance of the semiconductor integrated circuit device.

BRIEF DESCRIPTION OF THE DRAWINGS

FIGS. 11A-11C are plan views illustrating exemplary layout designs for standard cells according to the third embodiment.

FIGS. 12A and 12B are plan views illustrating other exemplary layout designs for standard cells according to the third embodiment.

DETAILED DESCRIPTION

Embodiments of the present disclosure will now be described in detail with reference to the accompanying drawings. In the following description of embodiments, it is assumed that a semiconductor integrated circuit device includes a plurality of standard cells, at least some of which includes a fin transistor.

Also, in this specification, a transistor which contributes to a logical function of the standard cells will be hereinafter referred to as an "active transistor," and a transistor other than such an active transistor, i.e., a transistor which does not contribute to any logical functions of the standard cells will be hereinafter referred to as a "non-active transistor." A fin which forms part of the "active transistor" will be hereinafter referred to as an "active fin," and a fin other than such a fin will be hereinafter referred to as a "dummy fin." In other words, the "dummy fin" refers herein to either a fin which forms part of a "non-active transistor" or a fin which does not form part of any transistor.

First Embodiment

Figure 1:
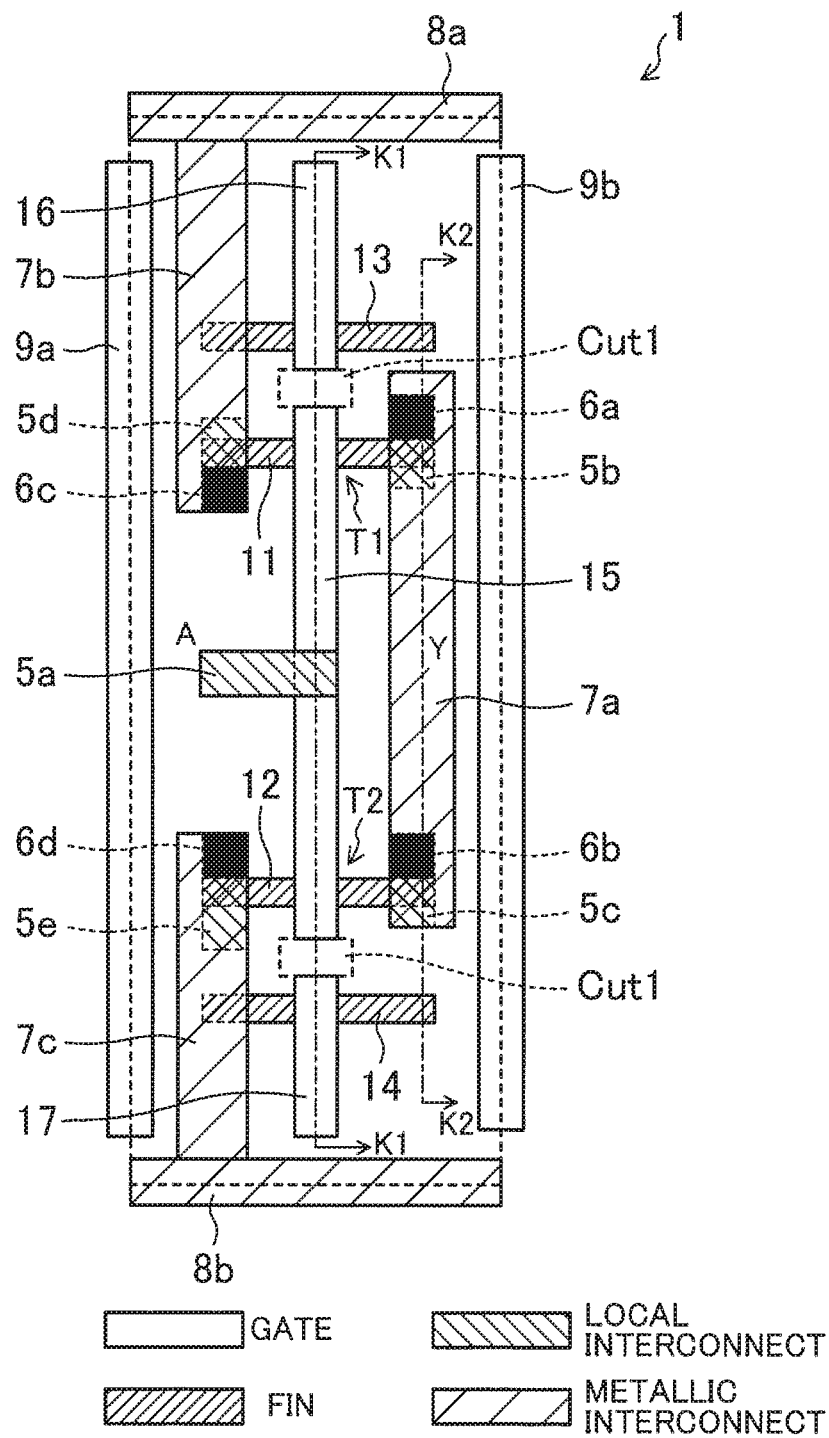
FIG. 1 is a plan view illustrating an exemplary layout design for a standard cell included in a semiconductor integrated circuit device according to a first embodiment.
Figure 2:
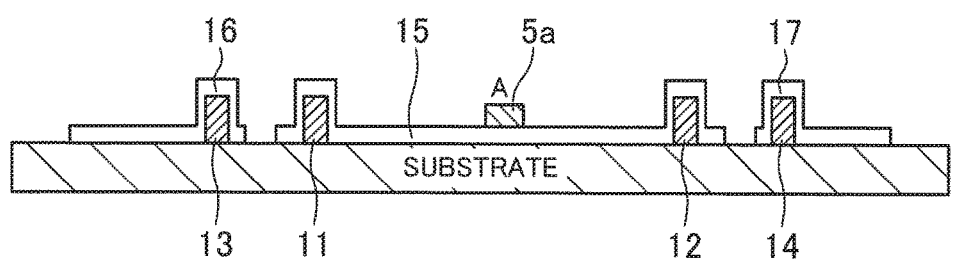
FIG. 2 is a cross-sectional view of the layout design of FIG. 1.
Figure 3:
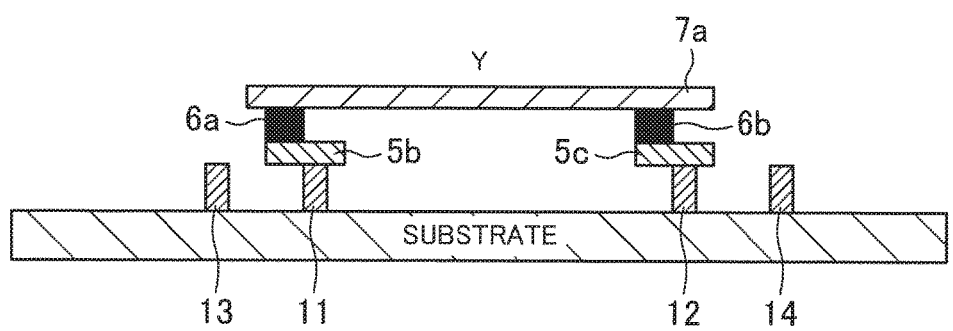
FIG. 3 is another cross-sectional view of the layout design of FIG. 1.

FIG. 1 is a plan view illustrating an exemplary layout design for a standard cell included in a semiconductor integrated circuit device according to a first embodiment. FIG. 2 is a cross-sectional view taken along the plane K1-K1 in the layout design of FIG. 1, and FIG. 3 is a cross-sectional view taken along the plane K2-K2 in the layout design of FIG. 1. In this embodiment, an inverter cell will be described for the sake of simplicity, but the present disclosure is not limited thereto.

The standard cell 1 illustrated in FIGS. 1-3 includes a fin transistor. The standard cell 1 includes a plurality of fins 11, 12, 13, and 14 extending in the lateral direction on the paper (corresponding to a first direction), and arranged in the vertical direction on the paper (corresponding to a second direction perpendicular to the first direction). In FIG. 1 and other plan views, a fin transistor is comprised of a fin and a gate formed on the fin. A local interconnect is formed so as to be located on the fin or gate in a region in which the local interconnect overlaps with the fin or gate when viewed in plan, and is electrically connected to the fin or gate. A metallic interconnect is located over the local interconnect, and is connected to the local interconnect through a contact. In FIG. 1, the fin is hatched to allow the reader to find the fin easily on the drawing. However, the fin is not hatched at its portion located under the gate. The local interconnect and metallic interconnect are also hatched differently, and a portion at which the metallic interconnect and local interconnect are connected together through a contact is indicated by the solid square. The other plan views are illustrated in the same or similar manner.

The fins 11 and 12 are active fins, and form part of active transistors T1 and T2 which contribute to the logical function of the standard cell 1. That is to say, the fins 11 and 12 are provided with a gate line 15, and a local interconnect 5a to which an input A is supplied is connected to the gate line 15. One end of the fin 11 is connected to a metallic interconnect 7a which outputs an output Y through a local interconnect 5b and a contact 6a. One end of the fin 12 is also connected to the metallic interconnect 7a through a local interconnect 5c and a contact 6b. The other end of the fin 11 is connected to a metallic interconnect 7b through a local interconnect 5d and a contact 6c. The metallic interconnect 7b is also connected to a power supply line 8a. The other end of the fin 12 is connected to a metallic interconnect 7c through a local interconnect 5c and a contact 6d. The metallic interconnect 7c is also connected to a power supply line 8b. The local interconnect refers to an interconnect provided in an interconnect layer which is in direct contact with the fin layer.

On the other hand, the fins 13 and 14 are dummy fins, which form part of non-active transistors that do not contribute to the logical function of the standard cell 1. The active fin 11 and the dummy fin 13 are arranged in a region of the same conductivity type (e.g., in a p-type region), and the active fin 12 and the dummy fin 14 are arranged in another region of the same conductivity type (e.g., in an n-type region). A gate line 16 is provided on the fin 13, and agate line 17 is provided on the fin 14. The gate lines 16 and 17, as well as a gate line 15 provided on the active fins 11 and 12, are arranged in a straight line extending in the vertical direction on the paper. However, the gate lines 16 and 17 are isolated from the gate line 15 via a cut-off region Cut1. In the manufacturing process, a gate line may be formed in a straight line in the vertical direction on the paper so as to extend the active fins 11 and 12 and the dummy fins 13 and 14, and then, may be cut in the cut-off region Cut1. Alternatively, the gate lines 15, 16, and 17 may be provided separately from each other.

The dummy fin 11 is disposed between the active fin 11 and the upper end of the standard cell 1 on the paper. No other fins are disposed between the dummy fin 13 and the upper end of the standard cell 1 on the paper. The dummy fin 13 is disposed closer to the upper end of the standard cell 1 on the paper than any other fin thereof. Likewise, the dummy fin 14 is disposed between the active fin 12 and the lower end of the standard cell 1 on the paper. No other fins are disposed between the dummy fin 14 and the lower end of the standard cell 1 on the paper. The dummy fin 14 is disposed closer to the lower end of the standard cell 1 on the paper than any other fin thereof.

According to the layout design of FIG. 1, the distance between the active fin 11 and an upwardly adjacent fin (i.e., the dummy fin 13 in this example) is determined uniquely regardless of the configuration of another standard cell upwardly adjacent to the standard cell 1. Likewise, the distance between the active fin 12 and a downwardly adjacent fin (i.e., the dummy fin 14 in this example) is also determined uniquely regardless of the configuration of another standard cell downwardly adjacent to the standard cell 1. Thus, the active transistors T1 and T2 formed by active fins 11 and 12 have constant current and capacitance characteristics regardless of the cell arrangement. This allows for reducing a design margin, and eventually improving the performance of the semiconductor integrated circuit device.

Figure 4:
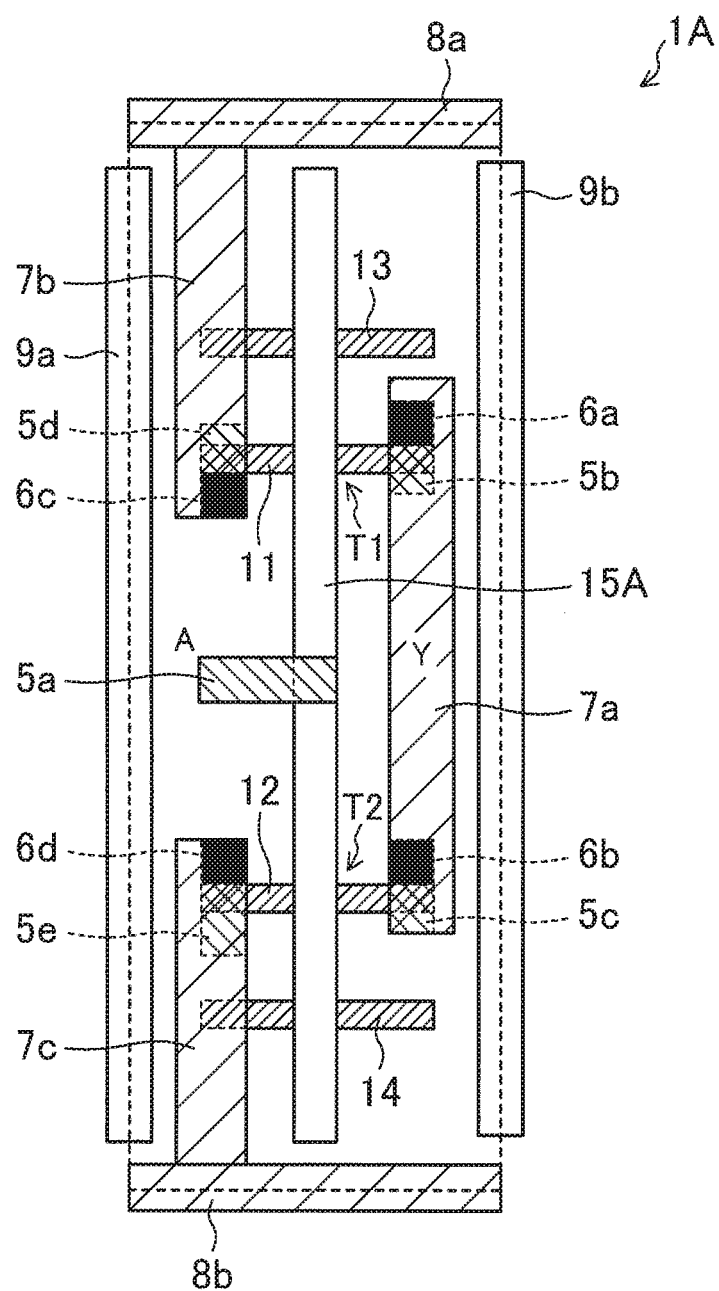
FIG. 4 is a plan view illustrating another exemplary layout design for a standard cell according to the first embodiment.
Figure 5:
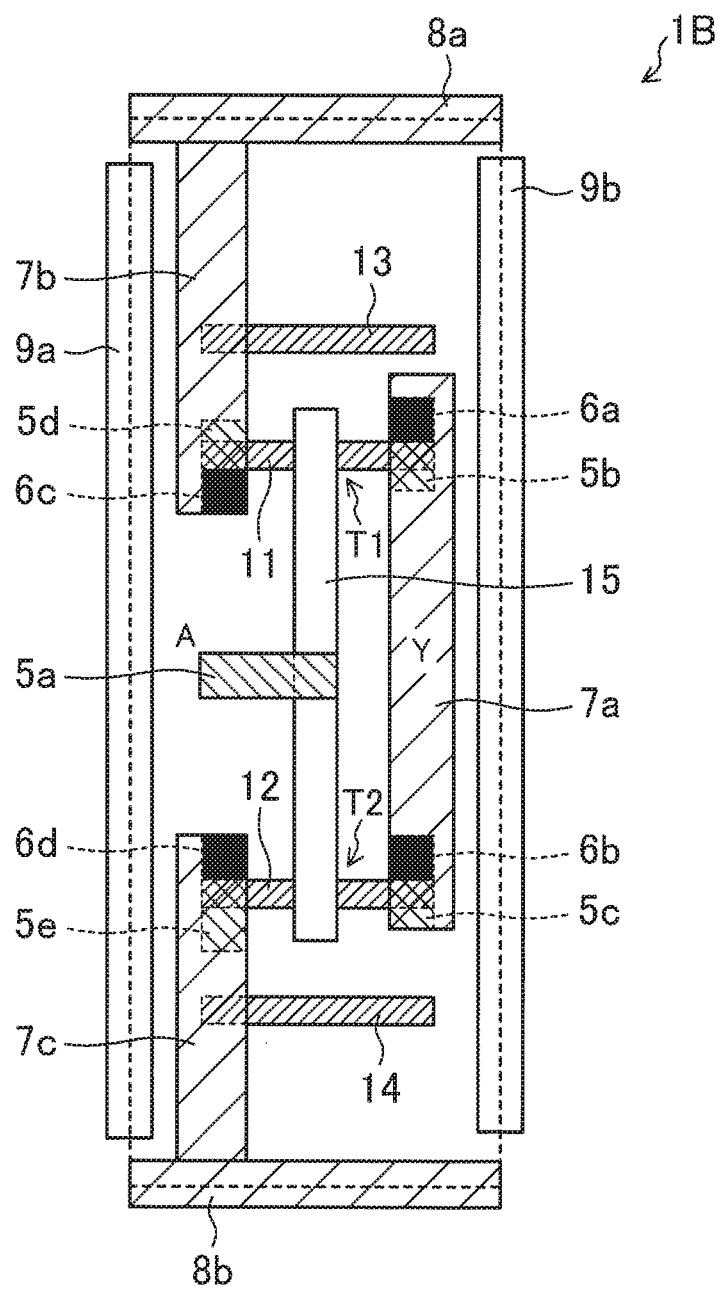
FIG. 5 is a plan view illustrating yet another exemplary layout design for a standard cell according to the first embodiment.

FIGS. 4 and 5 are plan views illustrating other exemplary layout designs for a standard cell according to this embodiment. In the standard cell 1A of FIG. 4, the gate lines provided on the dummy fins 13 and 14 in FIG. 1 are combined with the gate line provided on the active fins 11 and 12 in FIG. 1. In other words, a gate line 15A extending in the vertical direction on the paper is provided in common for the active fins 11 and 12 and the dummy tins 13 and 14. In the layout design of FIG. 4, the active transistors T1 and T2 formed by active fins 11 and 12 may have constant current and capacitance characteristics regardless of the cell arrangement, as in the layout design of FIG. 1. In addition, the process step of providing a cut-off region Cut 1 as illustrated in FIG. 1 may be omitted. This makes it easier to perform the manufacturing process of the standard cells. On the other hand, in the layout design of FIG. 1, gate capacitors formed by the dummy fins 13 and 14 are isolated from input terminals, thereby reducing an input capacitance. This allows for improving the performance of the semiconductor integrated circuit device.

On the other hand, in the standard cell 1B of FIG. 5, the dummy fins 13 and 14 are provided with no gate lines, and form part of no transistors. In the layout design of FIG. 5, the active transistors T1 and T2 formed by active fins 11 and 12 may have constant current and capacitance characteristics regardless of the cell arrangement, as in the layout design of FIG. 1. In addition, the process step of providing the cut-off region Cut1 as illustrated in FIG. 1 may be omitted. This makes it easier to perform the manufacturing process of the standard cells. On top of that, the input capacitance is also reducible as in the layout design of FIG. 1. This allows for improving the perform of the semiconductor integrated circuit device.

In the layout designs of FIGS. 1, 4, and 5, a dummy fin is provided between an active fin and the end of the cell in both of the n-type and p-type regions. However, this is only a non-limiting exemplary embodiment of the present disclosure. Alternatively, for example, such a dummy fin may be provided near the end of the cell in only one of the two regions. If a single standard cell includes multiple fin columns arranged in the vertical direction on the paper, a dummy fin is not necessarily provided for all of those fin columns. For example, even if a dummy fin is provided between an active fin and the end of the cell in any one of those fin columns, the active transistors in that fin column may have stabilized current and capacitance characteristics.

Second Embodiment

Figure 6:
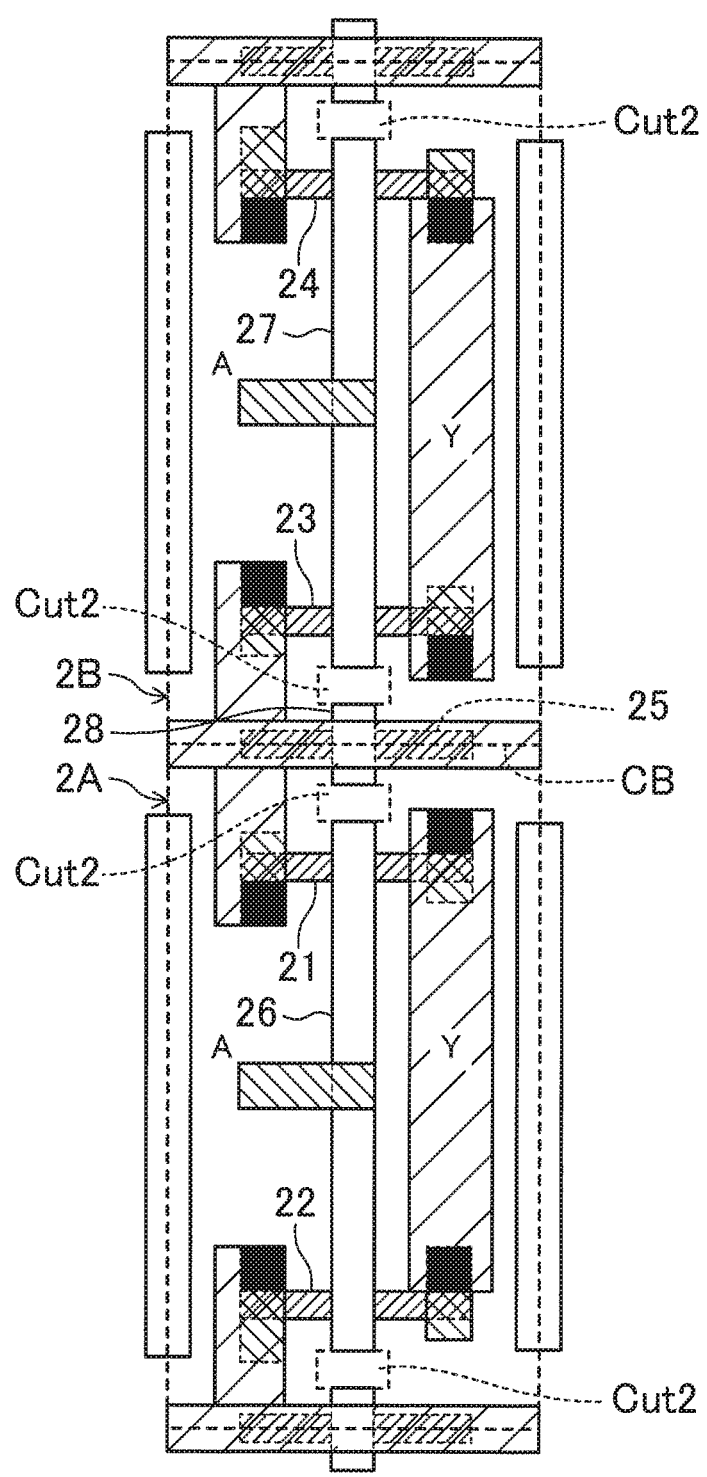
FIG. 6 is a plan view illustrating an exemplary layout design for a semiconductor integrated circuit device according to a second embodiment.

FIG. 6 is a plan view illustrating an exemplary layout design for a semiconductor integrated circuit device according to a second embodiment. In the following description of the second embodiment, an inverter cell will be described as one example for the sake of simplicity. However, this is only an exemplary embodiment of the present disclosure. Adjoining standard cells 2A and 2B may be cells of mutually different types.

The standard cells 2A and 2B illustrated in FIG. 6 each include a fin transistor. The standard cell 2A includes a plurality of fins 21 and 22 extending in the lateral direction on the paper (corresponding to a first direction), and arranged in the vertical direction on the paper (corresponding to a second direction perpendicular to the first direction). The fins 21 and 22 are active fins, and form part of active transistors which contribute to the logical function of the standard cell 2A. A gate line 26 is provided on the fins 21 and 22. Likewise, the standard cell 2B also includes a plurality of fins 23 and 24 extending in the lateral direction on the paper, and arranged in the vertical direction on the paper. The fins 23 and 24 are active fins, and form part of active transistors which contribute to the logical function of the standard cell 2B. A gate line 27 is provided on the fins 23 and 24.

In FIG. 6, the standard cells 2A and 2B are arranged adjacent to each other in the vertical direction on the paper. A dummy fin 25 is disposed on the cell boundary CB between the standard cells 2A and 2B. This dummy fin 25 and agate line 28 provided on this dummy fin 25 constitute a non-active transistor which does not contribute to the logical function of the standard cells 2A and 2B. In the manufacturing process, agate line may be formed in a straight line in the vertical direction on the paper so as to extend over the active fins 21, 22, 23, and 24, and then, may be cut in cut-off regions Cut2. Alternatively, the gate lines 26, 27, and 28 may be provided separately from each other.

According to the layout design of FIG. 6, in the standard cell 2A, the distance between the active fin 21 and an upwardly adjacent fin (i.e., the dummy fin 25 on the cell boundary CB in this example) is determined uniquely regardless of the configuration of the adjacent standard cell 2B. Likewise, in the standard cell 2B, the distance between the active fin 23 and a downwardly adjacent fin (i.e., the dummy fin 25 on the cell boundary CB in this example) is also determined uniquely regardless of the configuration of the adjacent standard cell 2A. Thus, the active transistors 21 and 23 arranged near the cell boundary CB may have constant current and capacitance characteristics regardless of the cell arrangement. This allows for reducing a design margin, and eventually improving the performance of the semiconductor integrated circuit device.

Furthermore, the standard cells 2A and 2B share the dummy fin 25. This allows for reducing the cell area while achieving the above advantage. Consequently, the overall area and manufacturing cost of the semiconductor integrated circuit device may be cut down.

Figure 7:
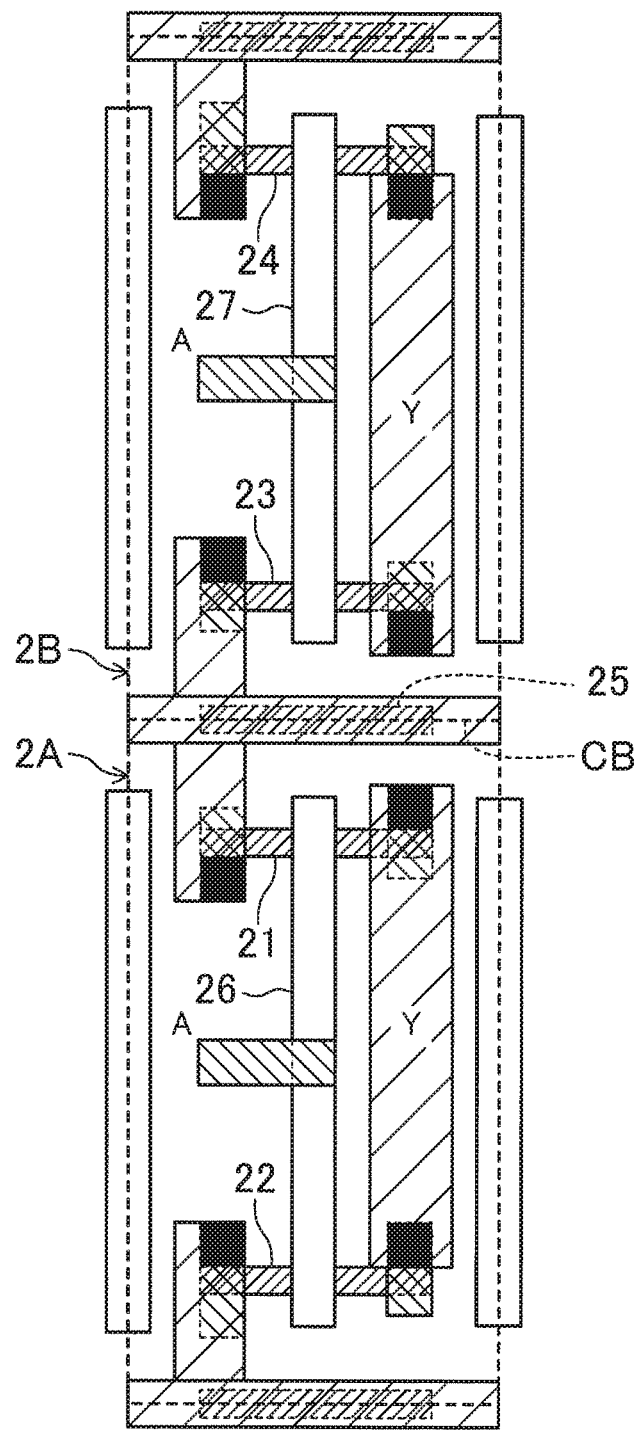
FIG. 7 is a plan view illustrating another exemplary layout design for a semiconductor integrated circuit device according to the second embodiment.

FIG. 7 is a plan view illustrating another exemplary layout design for a semiconductor integrated circuit device according to this embodiment. In FIG. 7, the dummy fin 25 disposed on the cell boundary CB is provided with no gate lines, and form part of no transistors. In the layout design of FIG. 7, the active transistors 21 and 23 may have constant current and capacitance characteristics regardless of the cell arrangement, as in the layout design of FIG. 6. In addition, the process step of providing the cut-off regions Cut 2 as illustrated in FIG. 6 may be omitted. This makes it easier to perform the manufacturing process of the standard cells.

Optionally, the dummy fin provided on the cell boundary may be connected to an overlying metallic interconnect in order to supply a potential.

Figure 8:
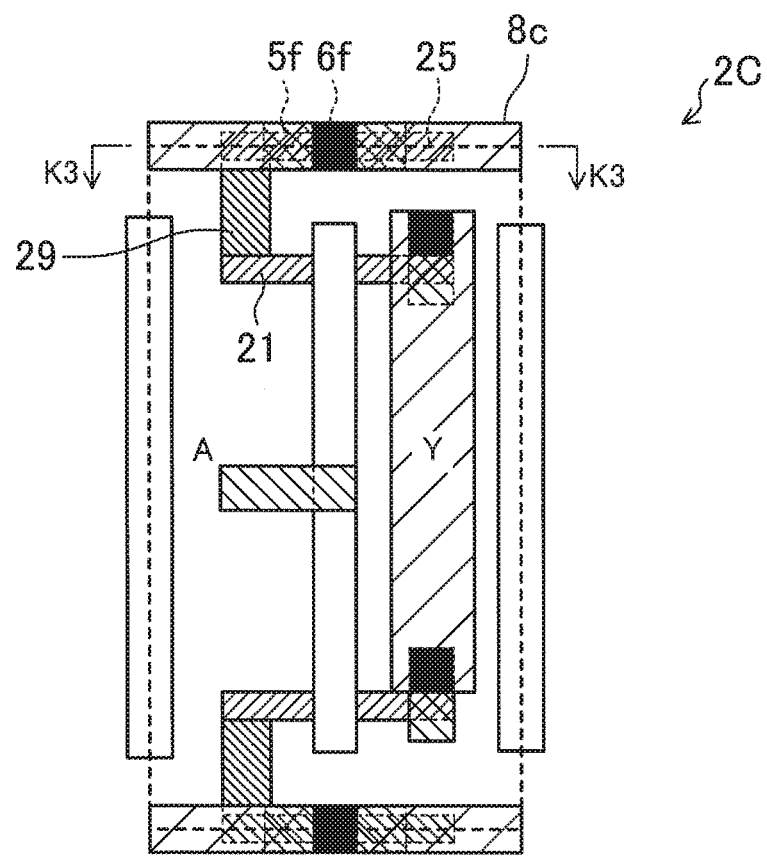
FIG. 8 is a plan view illustrating another exemplary layout design for a standard cell according to the second embodiment.
Figure 9:
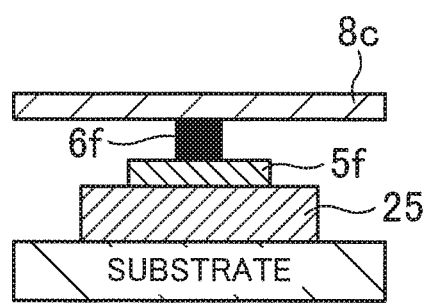
FIG. 9 is a cross-sectional view of the layout design of FIG. 8.

FIG. 8 is a plan view illustrating another exemplary layout design for a standard cell according to this embodiment. FIG. 9 is a cross-sectional view taken along the plane K3-K3 in the layout design of FIG. 8.

The standard cell 2C illustrated in FIGS. 8 and 9 includes a metallic interconnect 8c provided over the dummy fin 25 and extending in the lateral direction on the paper. The dummy fin 25 is connected to this metallic interconnect 8c through a local interconnect 5f and a contact 6f. This configuration allows the dummy fin 25 to be supplied with a power supply potential that has been supplied to the metallic interconnect 8c. In the standard cell 2C having the layout design of FIG. 8, the dummy fin 25 is connected to the active fin 21 through a diffusion layer interconnect 29. This allows for supplying the source of the active transistor formed by the active fin 21 with the power supply potential.

Third Embodiment

Figure 10:
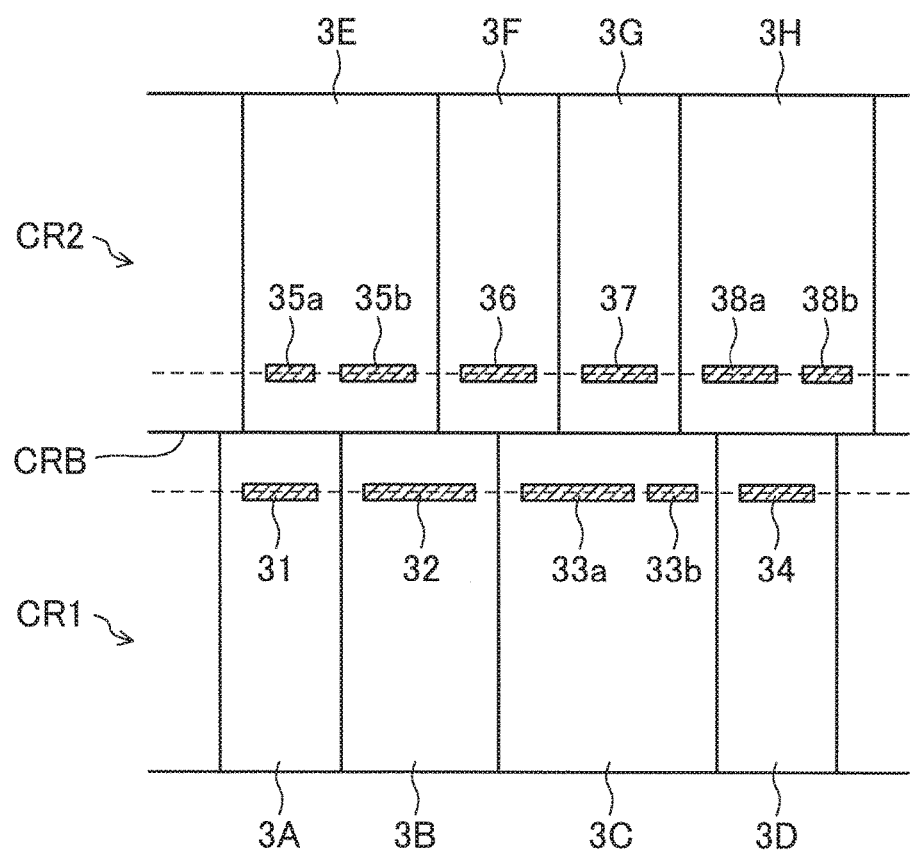
FIG. 10 is a plan view illustrating an exemplary layout design for a semiconductor integrated circuit device according to a third embodiment.

FIG. 10 is a plan view illustrating an exemplary layout design for a semiconductor integrated circuit device according to a third embodiment. FIG. 10 illustrates first cell row CR1 including standard cells 3A, 3B, 3C, and 3D that are arranged side by side in the lateral direction on the paper (corresponding to a first direction), and a second cell row CR2 including standard cells 3E, 3F, 3G, and 3H that are arranged side by side in the lateral direction on the paper, and disposed adjacent to the first cell row CR1 in the vertical direction on the paper (corresponding to a second direction perpendicular to the first direction). FIG. illustrates only cell frames and fins arranged along the cell row boundary CRB between the first and second cell rows CR1 and CR2 for the sake of simplicity with illustration of the other fins omitted. In the first cell row CR1, fins 31, 32, 33a, 33b, and 34 extending in the lateral direction on the paper are arranged in a straight line along the cell row boundary CRB, in the second cell row CR2, fins 35a, 35b, 36, 37, 38a, and 38b extending in the lateral direction on the paper are arranged in a straight line along the cell row boundary CRB.

Now, take a look at the first cell row CR1, for example. The standard cell 3A includes an active transistor with a fin structure, and a fin 31 is an active fin arranged closest to the cell row boundary CRB in the standard cell 3A. In the standard cells 3B, 3C, and 3D arranged continuously with the standard cell 3A, fins 32, 33a, 33b, and 34 are arranged at the same position in the vertical direction on the paper as the active fin 31. For example, the standard cell 3B includes no active transistors with a fin structure, and the fin 32 is a dummy fin. In the standard cell 3C, the fin 33a is an active fin but the fin 33b is a dummy fin.

As can be seen, in the first cell row CR1, the fins including dummy fins are arranged in the respective cells along the cell row boundary CRB. Likewise, in the second cell row CR2, the fins including dummy fins are arranged in the respective cells along the cell row boundary CRB. Such a layout design determines uniquely the distance between an active fin located near the cell row boundary CRB and a fin located opposite the active fin across the cell row boundary CRB, regardless of the layout designs of the cell rows. Thus, the active transistors near the cell boundary CB may have constant current and capacitance characteristics regardless of the cell arrangement. This allows for reducing a design margin, and eventually improving the performance of the semiconductor integrated circuit device.

It is recommended that the active fin 31 and the fins 32, 33a, 33b, and 34 aligned with the active fin 31 be arranged closer to the cell row boundary CRB than the other fins in the first cell row CR1.

FIGS. 11A-11C and 12A and 12B illustrate exemplary standard cells any of which may be used as the standard cell 3B of FIG. 10. Each of these standard cells includes no active transistors, and has a dummy fin disposed near an end thereof.

FIG. 11A illustrates a layout design for a TAP cell, i.e., a cell with a TAP structure having the function of fixing a substrate potential. The TAP cell of FIG. 11A includes a diffusion region 41 and a power supply line 42 supplying this diffusion region 41 with power. The dummy fin 32 is arranged separately from such a TAP structure.

FIG. 11B illustrates an exemplary layout design for an antenna cell, i.e., a cell having the function of connecting an in-chip interconnect and a substrate together. The antenna cell of FIG. 11B includes a diffusion region 43 and an antenna terminal 44 connecting this diffusion region 43 and the in-chip interconnect together. The dummy fin 32 is arranged separately from such an antenna structure.

FIG. 11C illustrates an exemplary layout design for a filler cell, i.e., a cell arranged in a vacant region in the cell row. In the filler cell of FIG. 11C, six dummy fins, including the dummy fin 32, and gate lines 45a and 45b constitute non-active transistors.

FIGS. 12A and 12B illustrate layout designs of capacitor cells. In the capacitor cell of FIG. 12A, six dummy fins, including the dummy fin 32, and gate lines 46a, 46b, 46c, and 46d constitute non-active transistors. The capacitor cell of FIG. 12B includes gate lines 47a and 47b having a broad width. Six dummy fins, including the dummy fin 32, and gate lines 47a and 47b constitute non-active transistors.

Figure 13:
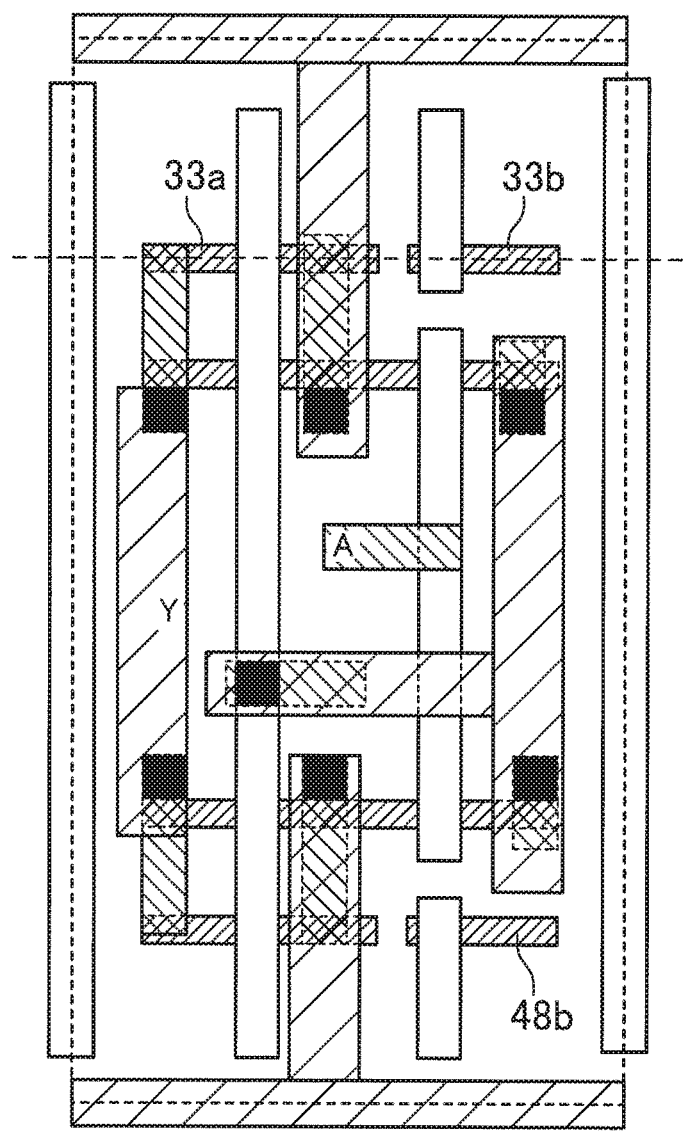
FIG. 13 is a plan view illustrating another exemplary layout design for a standard cell according to the third embodiment.
Figure 14:
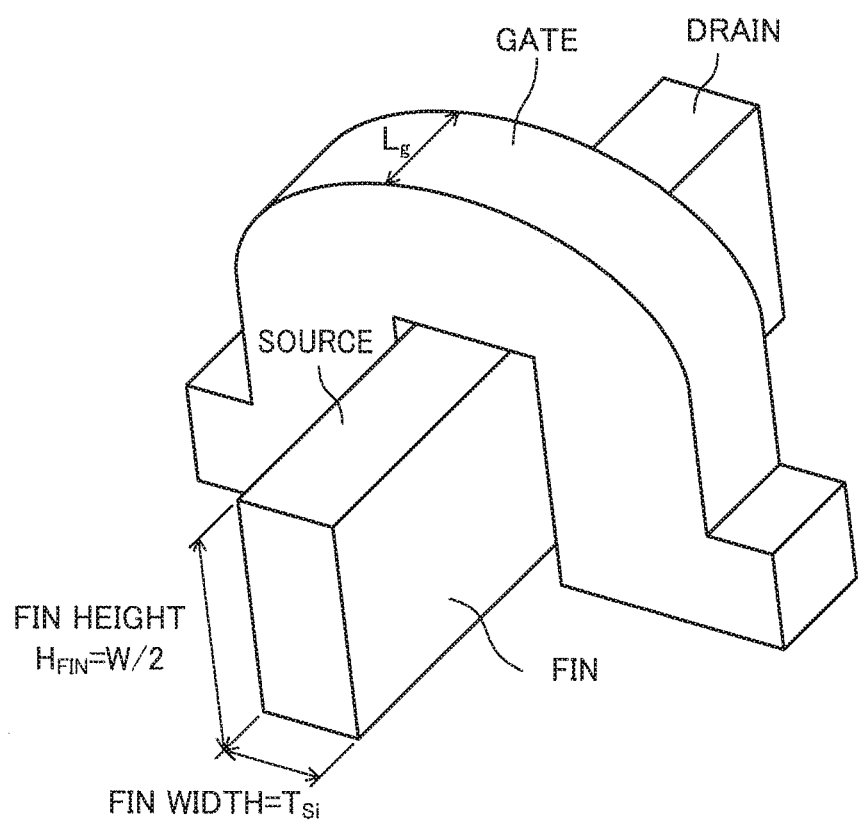
FIG. 14 schematically illustrates a transistor having a fin structure.

FIG. 13 illustrates an exemplary standard cell which may be used as the standard cell 3C of FIG. 10. This standard cell includes active transistors, and have dummy fins arranged, together with active fins, near an end of the cell. The standard cell of FIG. 13 is a multi-stage circuit in which two logic inversion circuits are connected together in series, and these logic inversion circuits connected to an input terminal A include dummy fins 33b and 48b.

The cell designs illustrated in FIGS. 11A-11C, 12A, 12B and 13 are just examples. Any other cell design may be used to implement the embodiments described above, as long as dummy fins are arranged such that fins are arranged in a straight line along cell row boundary.

Note that elements of two or more of the embodiments described above may be used in any arbitrary combination without departing from the spirit of the present disclosure.

The present disclosure is capable of reducing, in a semiconductor integrated circuit device including a standard cell with a fin transistor, an influence of a cell arrangement on the characteristics of the fin transistor. Thus, the present disclosure is useful for improving the performance of the semiconductor integrated circuit device.

What is claimed is:

1. A semiconductor integrated circuit device comprising:
    a first cell row comprised of standard cells arranged in a first direction; and
    a second cell row comprised of standard cells arranged in the first direction, and disposed adjacent to the first cell row in a second direction that is perpendicular to the first direction, wherein
    the first cell row comprises:
    a first standard cell having fins extending in the first direction and including an active transistor with a fin structure, the active transistor having at least one of the fins and a gate line extending in the second direction; and
    a second standard cell which is a TAP cell having a function of fixing a substrate potential, the second standard cell being adjacent to the first standard cell in the first direction, and including fins extending in the first direction, and
    the first standard cell has a first fin disposed closest to a cell row boundary between the first and second cell rows, and the second standard cell has a dummy fin disposed at the same position in the second direction as the first fin and a diffusion region supplied with power and disposed at a position farther from the cell row boundary than the dummy fin in the second direction.

2. The semiconductor integrated circuit device of claim 1, wherein the second standard cell has a power supply line disposed at the cell row boundary and supplying the diffusion region with power.

* * * * *